(12) United States Patent
Chun

(10) Patent No.: US 7,238,606 B2
(45) Date of Patent: Jul. 3, 2007

(54) SEMICONDUCTOR DEVICES AND METHOD FOR FABRICATING THE SAME

(75) Inventor: In Kyu Chun, Gyeonggi-do (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 0 days.

(21) Appl. No.: 11/026,941

(22) Filed: Dec. 30, 2004

(65) Prior Publication Data

US 2005/0146044 A1    Jul. 7, 2005

(30) Foreign Application Priority Data

Dec. 30, 2003    (KR) .................. 10-2003-0100705

(51) Int. Cl.
*H01L 21/4763* (2006.01)
*H01L 21/44* (2006.01)
*H01L 21/461* (2006.01)

(52) U.S. Cl. ............... 438/626; 438/627; 438/629; 438/631; 438/633; 438/643; 438/645; 438/648; 438/652; 438/653; 438/656; 438/672; 438/678; 438/679; 438/685; 438/689; 438/690; 438/691; 438/692; 257/E21.641; 257/E21.575; 257/E21.546

(58) Field of Classification Search ........ 438/626–627, 438/629, 631, 633, 637, 643, 645, 648, 652–653, 438/656, 672, 678–679, 685, 687, 689, 690–692
See application file for complete search history.

(56) References Cited

U.S. PATENT DOCUMENTS 6,566,250 B1    5/2003  Tu et al.
6,706,625 B1 *  3/2004  Sudijono et al. ............ 438/637
6,790,778 B1    9/2004  Cheng et al.
6,927,113 B1 *  8/2005  Sahota et al. ............... 438/200
7,008,871 B2 *  3/2006  Andricacos et al. ......... 438/652
2002/0005583 A1 *  1/2002  Harada et al. .............. 257/758
2005/0062165 A1 *  3/2005  Saenger et al. ............. 257/774

* cited by examiner

*Primary Examiner*—Walter Lindsay, Jr.
*Assistant Examiner*—Mohsen Ahmadi
(74) *Attorney, Agent, or Firm*—Saliwanchik, Lloyd & Saliwanchik

(57) ABSTRACT

Methods for fabricating a copper interconnect of a semiconductor device are disclosed. An example method for fabricating a copper interconnect of a semiconductor device deposits a first insulating layer on a substrate having at least one predetermined structure, forms a trench and via hole through the first insulating layer by using a dual damascene process, and deposits a barrier layer along the bottom and the sidewalls of the trench and via hole. The example method forms a copper interconnect by filling the trench and via hole with copper and performing a planarization process, deposits a Ta/TaN layer over the substrate including the copper interconnect, removes some portion of the Ta/TaN layer so that the Ta/TaN layer remains only on the copper interconnect, deposits a second insulating layer over the substrate including the Ta/TaN layer, forms a via hole through the second insulating layer by removing some portion of the second insulating layer, and fills the via hole with a conductive material to complete a via.

3 Claims, 5 Drawing Sheets

SEMICONDUCTOR DEVICES AND METHOD FOR FABRICATING THE SAME

RELATED APPLICATION

This application claims the benefit of Korean Application No. 10-2003-0100705, filed on Dec. 30, 2003, which is hereby incorporated herein by reference in its entirety.

TECHNICAL FIELD

The present disclosure relates to a semiconductor device and, more particularly, to methods for fabricating a copper interconnect of a semiconductor device.

BACKGROUND

With the high-integration of semiconductor devices, known metals such as tungsten, copper, or alloys thereof have been turned out to be unsuitable for an interconnect material of a semiconductor device because they have a high specific resistance and cause electro migration (EM) or stress migration (SM), thereby deteriorating reliability of the semiconductor device. EM is a defect due to the increase in current density within a metal interconnect. In other words, EM is created because the current density increases by high-speed operation of the semiconductor device according to a fine interconnect pattern. SM is a creep rupture (failure) mode caused by imposing tensile mechanical stress on the metal interconnect. The mechanical stress is created by the difference in thermal expansion coefficient between the metal interconnect and an insulating layer to protect the metal interconnect. The mechanical stress increases as the width of the metal interconnect becomes narrower.

To obviate the above-mentioned problems, copper has been suggested as an alternative for known interconnect materials. Copper has a low specific resistance and ensures reliability of a semiconductor device. In addition, copper alloy has high corrosion-resistance and ensures reliability of the interconnect although it has a relatively high specific resistance in comparison with copper.

A copper dual damascene process, which inlays metal in an interconnect line, has been developed as an alternative because efforts to improve a copper etching method proved to be unsuccessful. The copper dual damascene process has been verified as an excellent process in terms of process affinity and cost reduction although it had been confronted with barriers in terms of apparatus due to completely different structures and across-the-board changes.

FIGS. 1a through 1d are cross-sectional views illustrating a known process of fabricating a copper interconnect of a semiconductor device. Referring to FIG. 1a, an insulating layer 10 is deposited on a substrate with at least one predetermined structure. A trench and via hole is formed through the insulating layer 10 by using a dual damascene process. A barrier layer 11 is then deposited along the bottom and the sidewalls of the trench and via hole. The trench and via hole is filled with copper by using an electrochemical plating (ECP) process and then planarized by using a chemical mechanical polishing (CMP) process to complete a lower copper interconnect 12.

Referring to FIG. 1b, a SiN layer is deposited over the structure of FIG. 1a to form a capping layer 13. The SiN layer has a thickness of about 700 Å. Referring to FIG. 1c, an interlayer dielectric (ILD) layer 14 is deposited on the capping layer 13. Referring to FIG. 1d, some portion of the ILD layer 14 and capping layer 13 is removed by an etching process using a predetermined pattern to form a via hole. The via hole is then filled with a conductive material to complete a via 15.

However, the above-described known method of forming a copper interconnect has several problems. First, if there is an oxidized area on the surface of the copper interconnect, the adhesion between the copper interconnect and the capping layer weakens and, as a result, the SiN layer as the capping layer 13 loosens. Constantly, the copper of the interconnect is diffused into the portion in which the SiN layer gets loose. Such copper diffusion may cause a short circuit between interconnects. Second, when the via is formed to connect the upper and lower interconnects, the upper interconnect may not be connected with the lower interconnect if the SiN layer as the capping layer within the via hole is completely removed. Third, the SiN layer may raise the total dielectric constant of the upper and lower interconnects because the SiN layer itself has a high dielectric constant.

DETAILED DESCRIPTION

Figure 1A:
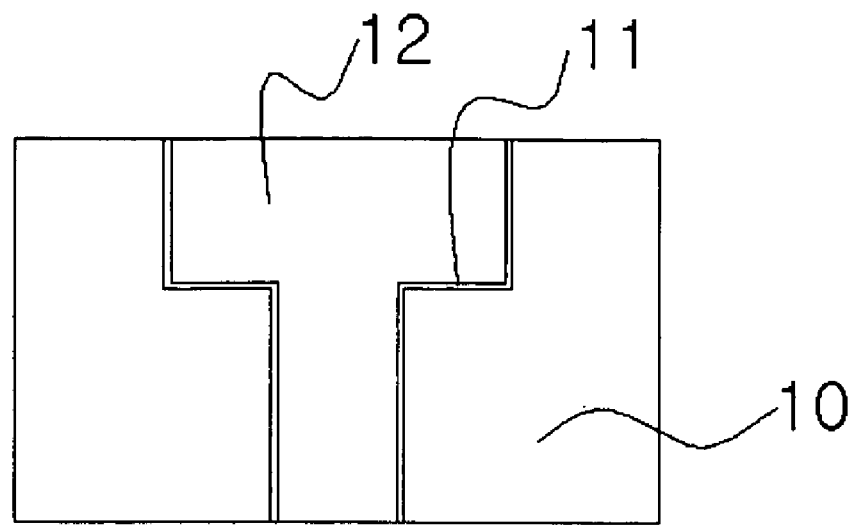
FIGS. 1a through 1d are cross-sectional views illustrating a known process of fabricating a copper interconnect of a semiconductor device.
Figure 1B:
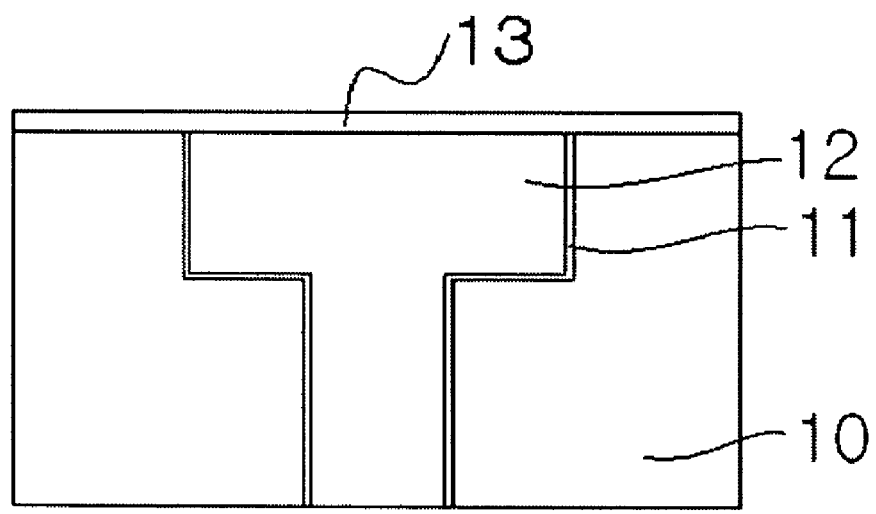
Figure 1C:
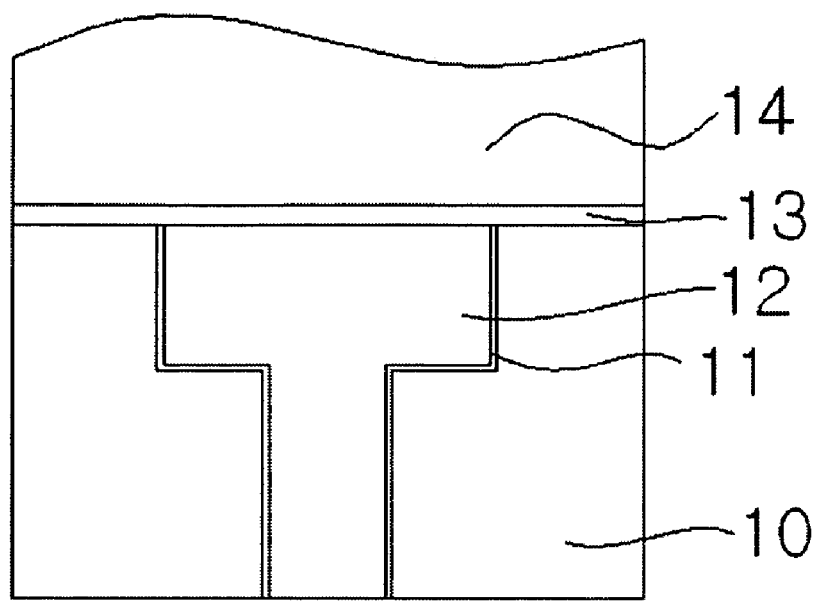
Figure 1D:
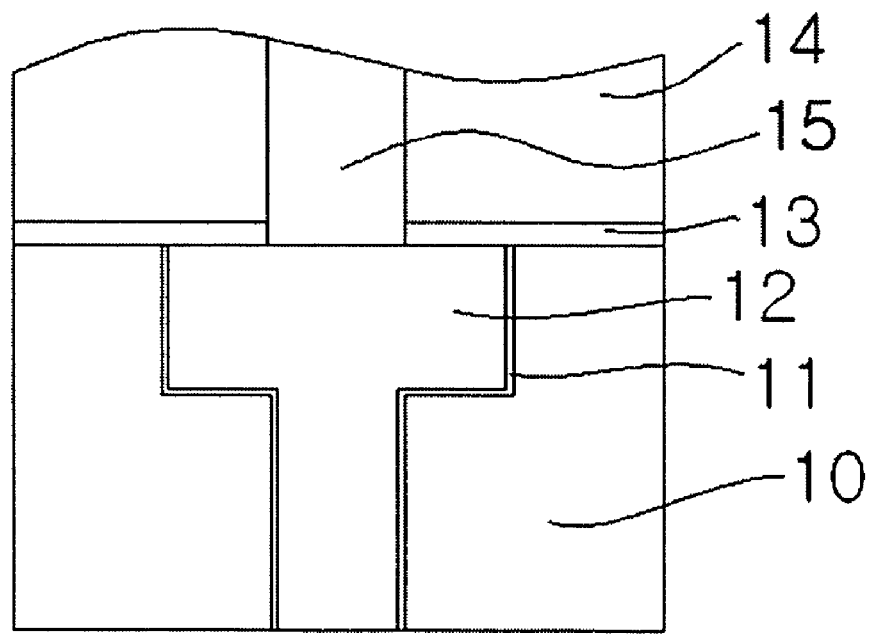
Figure 2A:
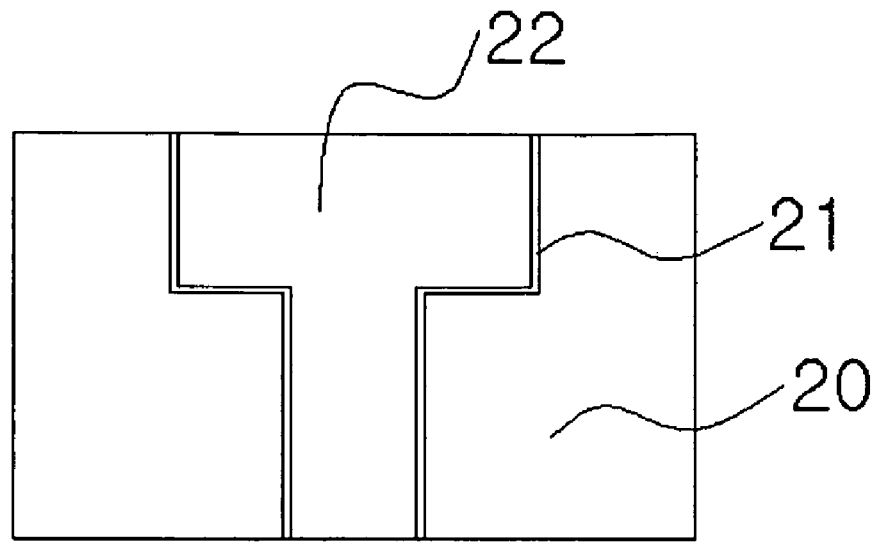
FIGS. 2a through 2e are cross-sectional views illustrating an example process of fabricating a copper interconnect of a semiconductor device.

FIGS. 2a through 2e are cross-sectional views illustrating an example process of fabricating a copper interconnect of a semiconductor device. Referring to FIG. 2a, a substrate (not shown) having at least one predetermined structure is prepared. A first insulating layer 20 is deposited over the substrate. A trench and via hole are formed through the first insulating layer 20 by using a dual damascene process. A barrier layer 21 is then formed along the bottom and the sidewalls of the trench and via hole. The barrier layer 21 is preferably made of Ta/TaN. The trench and via hole is filled with copper by using an ECP process and then planarized by using a CMP process to form a lower copper interconnect 22. In the illustrated example, the barrier layer 21 made of Ta/TaN prevents not only the copper of the lower interconnect from being diffused into the first insulating layer 20, but also impurities such as oxygen in the first insulating layer 20 from being diffused into the lower copper interconnect 22.

Figure 2B:
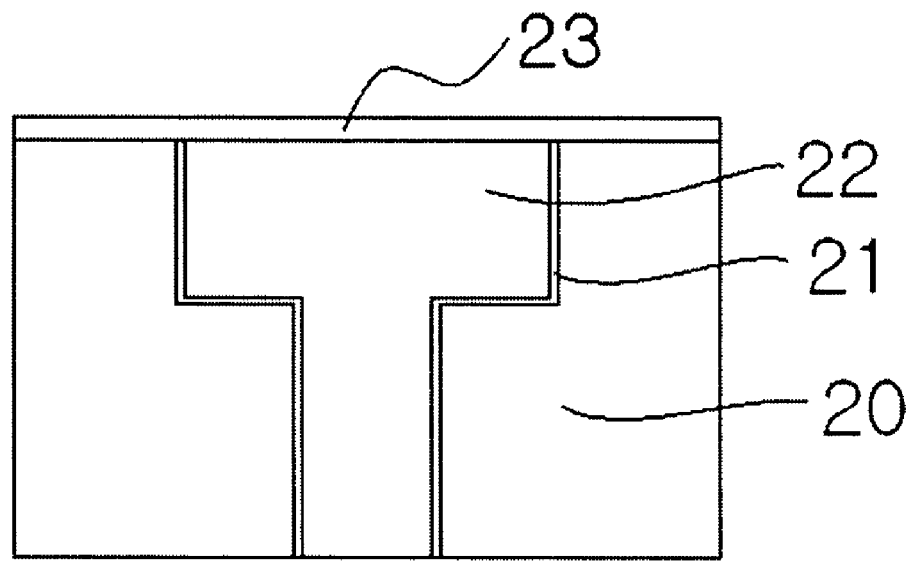

Referring to FIG. 2b, a Ta/TaN layer 23 for a capping layer is deposited over the structure of FIG. 2a.

Figure 2C:
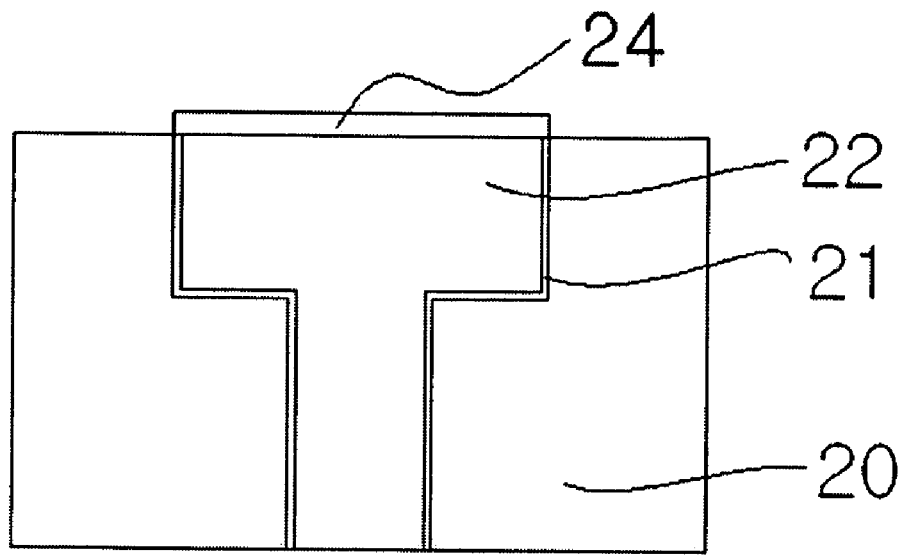

Referring to FIG. 2c, a photoresist pattern is formed on the structure of FIG. 2b by a photolithography process using the same mask that was used in the above-mentioned dual damascene process. The Ta/TaN layer 23 on the first insulating layer 20 is removed by using the photoresist pattern so that the Ta/TaN layer 23 remains only on the lower copper interconnect 22. Thus, a capping layer 24 of Ta/TaN is formed on the lower copper interconnect.

Figure 2D:
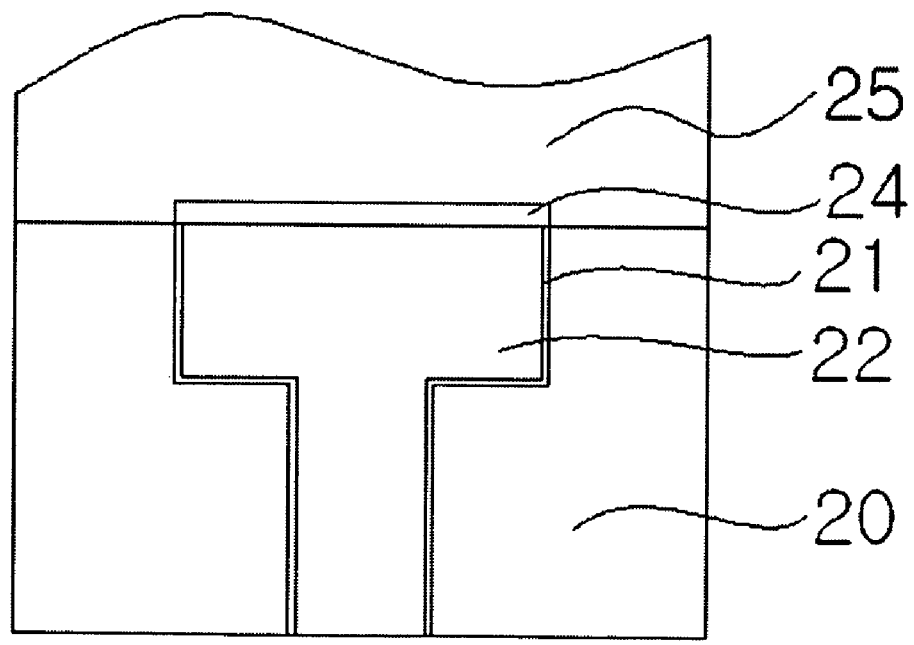

Referring to FIG. 2d, a second insulating layer 25 is deposited over the structure of FIG. 2c.

Figure 2E:
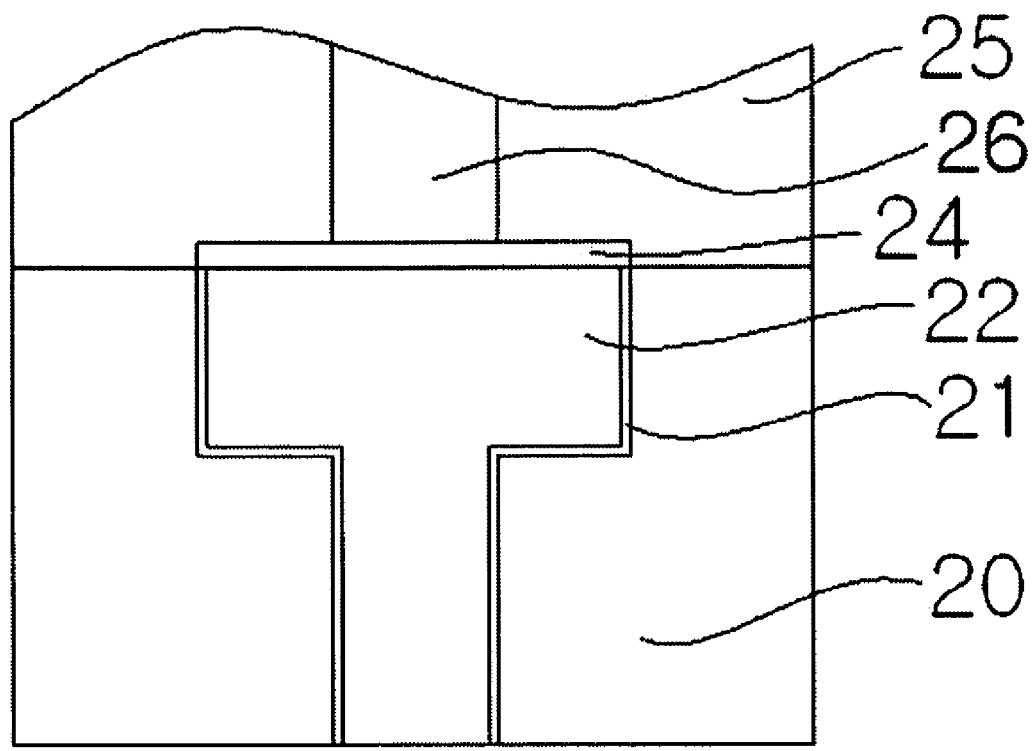

Referring to FIG. 2e, some portion of the second insulating layer 25 is removed by an etching process using a predetermined photoresist pattern. Thus, a via hole is formed through the second insulating layer 25. The via hole is then filled with a conductive material to complete a via 26. The via 26 connects the lower copper interconnect 22 with an upper metal interconnect (not shown) to be formed by a later unit process. As above-mentioned, the conventional technology using the SiN layer as the capping layer has to completely remove the SiN layer within the via hole in order to complete the electrical connection between the upper copper interconnect and the lower metal interconnect. In the illustrated example process, however, the via achieves a good electric connection between the lower copper interconnect and the upper metal interconnect although the capping layer within the via hole is not completely removed, because the Ta/TaN layer with good electric characteristics is used as the capping layer.

From the foregoing, persons of ordinary skill in the art will appreciate that by using the Ta/TaN layer as the capping layer instead of the SiN layer, the above-described methods of fabricating a copper interconnect enhance the adhesion between the capping layer and the lower copper interconnect, prevent a short circuit between interconnects, which is caused because the capping layer is not completely removed during the via formation process, and obviate increase in dielectric constant of total interconnects due to the capping layer with the high dielectric constant.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A method for fabricating a copper interconnect of a semiconductor device comprising:
    depositing a first insulating layer on a substrate having at least one predetermined structure;
    forming a trench and a via hole through the first insulating layer by using a dual damascene process;
    depositing a barrier layer along the bottom and the sidewalls of the trench and via hole;
    forming a copper interconnect by filling the trench and via hole with copper and performing a planarization process, wherein filling the trench and via hole with copper is performed by using an electrochemical plating process;
    depositing a Ta/TaN layer over the substrate including the copper interconnect;
    removing some portion of the Ta/TaN layer so that the Ta/TaN layer remains only on the copper interconnect and the barrier layer by performing photolithography and etching processes;
    depositing a second insulating layer over the substrate including the Ta/TaN layer;
    forming a via hole through the second insulating layer by removing some portion of the second insulating layer; and
    filling the via hole with a conductive material to complete a via.

2. A method as defined in claim 1, wherein the barrier layer is made of Ta/TaN.

3. A method as defined by claim 1, wherein the Ta/TaN layer on the copper interconnect is used as a capping layer.

* * * * *